United States Patent
Ou Yang et al.

(10) Patent No.: US 7,433,800 B2
(45) Date of Patent: Oct. 7, 2008

(54) SYSTEM AND METHOD FOR MEASURING PERFORMANCE OF A VOLTAGE REGULATOR MODULE ATTACHED TO A MICROPROCESSOR

(75) Inventors: Ming-Shiu Ou Yang, Shenzhen (CN);
Wei-Yuan Chen, Shenzhen (CN);
Sung-Kuo Ku, Shenzhen (CN);
Cho-Hao Wang, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 36 days.

(21) Appl. No.: 11/309,030

(22) Filed: Jun. 12, 2006

(65) Prior Publication Data
US 2007/0126449 A1   Jun. 7, 2007

(30) Foreign Application Priority Data
Oct. 20, 2005   (CN) .................. 2005 1 0100561

(51) Int. Cl.
*G01R 31/02*   (2006.01)
(52) U.S. Cl. .................. 702/182; 324/763; 323/282; 323/283; 323/304; 323/311; 363/65; 363/73
(58) Field of Classification Search .............. 702/182; 324/763; 361/803, 761; 323/282–283, 272, 323/304, 311; 363/65, 73
See application file for complete search history.

(56) References Cited

U.S. PATENT DOCUMENTS

| 6,795,009 | B2 * | 9/2004 | Duffy et al. ............... 341/155 |
| 7,000,122 | B2 | 2/2006 | Zafarana et al. |
| 2004/0150928 | A1 * | 8/2004 | Goodfellow et al. ........ 361/90 |
| 2004/0227538 | A1 | 11/2004 | Harris |

* cited by examiner

*Primary Examiner*—John E Barlow, Jr.
*Assistant Examiner*—Hien X Vo
(74) *Attorney, Agent, or Firm*—Wei Te Chung

(57) ABSTRACT

A system for measuring performance of a voltage regulator module (VRM) attached to a microprocessor includes: a voltage transient tester (VTT) fixture (5) for setting different working voltage levels of the VRM; an oscillograph (2) for measuring transient voltage levels of the VRM, and generating a transient voltage waveform according to the transient voltage levels; an voltmeter (3) for measuring steady voltage levels of the VRM under thermal effects generated by the microprocessor; a direct current (DC) electronic load (4) for educing load currents from the VRM; and a measurement control module (10) installed in a computer (1) for generating load current control signals, controlling the DC electronic load to educe the load currents from the VRM according to the load current control signals, and generating a performance report of the VRM by integrating various measurement results.

15 Claims, 3 Drawing Sheets

SYSTEM AND METHOD FOR MEASURING PERFORMANCE OF A VOLTAGE REGULATOR MODULE ATTACHED TO A MICROPROCESSOR

FIELD OF THE INVENTION

The present invention generally relates to the field of voltage regulator modules (VRMs) attached to microprocessors in electronic systems, and more particularly to a system and method for measuring performance of a voltage regulator module (VRM) attached to a microprocessor.

DESCRIPTION OF RELATED ART

In recent years, overall power consumption of microprocessors has increased due to an increased microprocessor clock frequency to process complicated data. When power demands increase, the core voltage of the microprocessors drops significantly. Voltage drops may cause failure or malfunction of the microprocessors. In order to avoid voltage drops, designers have developed a voltage regulator module (VRM) for transforming the working voltage to supply a microprocessor with the core voltage of corresponding to the microprocessor.

All VRMs attached to microprocessors are mounted on motherboards. Layout and soldering quality of the motherboards may directly affect the microprocessor's voltage waveforms and voltage levels received from the VRM. Therefore, it is necessary to measure the transient voltage level of a microprocessor to know the actual voltage waveform fed to the microprocessor. Based on this concern, Intel released a transient load tester fixture called a voltage transient tester (VTT) fixture. This VTT fixture design requires a set of specific measurement devices to test each specific microprocessor, and also requires different load currents for each microprocessor type, such as socket 370, socket 423, etc.

In order to ensure that the VRM of the microprocessor is in a proper operation state, the manufacturer must measure and ensure that a performance of the VRM falls within the operating specifications (i.e. Intel VRD11.0) after the VRM has been installed on the motherboard. Therefore, VRM manufacturers use the VTT fixture for measuring the VRM performance. However, the VTT fixture cannot ensure the accuracy of measurement results because it alone cannot be ensured that the measurement devices are absolutely verifiable and correctly calibrated. Moreover, the VTT fixture may be destroyed because of thermal effects generated by the VRM of the microprocessor.

What is needed, therefore, is a system and method for measuring performance of a VRM attached to a microprocessor that can educe load currents from the VRM to a direct current (DC) electronic load by utilizing the VTT fixture, so as to reduce the VTT fixture malfunction and improve the accuracy of the measurement results.

SUMMARY OF THE INVENTION

A preferred embodiment of a system for measuring performance of a voltage regulator module (VRM) attached to a microprocessor in accordance with a preferred embodiment includes an oscillograph, a voltmeter, a direct current (DC) electronic load, a voltage transient tester (VTT) fixture, and a measurement control module installed in a computer.

The VTT fixture connected to the VRM is used for setting different working voltage levels of the VRM in order to have the VRM work in different load currents. The oscillograph connected to the computer is used for measuring transient voltage levels of the VRM under the different load currents, and for generating a transient voltage waveform according to the transient voltage levels. The voltmeter connected to the computer is used for measuring steady voltage levels of the VRM under thermal effects generated by the microprocessor. The DC electronic load connected to the computer is used for educing load currents of the VTT fixture from the VRM. The measurement control module is used for generating load current control signals, for controlling the DC electronic load to educe the load currents from the VRM according to the load current control signals, and for generating a performance report of the VRM by integrating various measurement results the transient voltage levels, the transient voltage waveform, the steady voltage levels, and the values of the load currents.

Another preferred embodiment provides an electronic method for measuring performance of a voltage regulator module attached to a microprocessor by utilizing the above system. The method includes the steps of: (a) generating load current control signals to control a DC electronic load to educe load currents of the VTT fixture from the VRM; (b) controlling the DC electronic load to educe the load currents from the VRM according to the load current control signals; (c) measuring transient voltage levels of the VRM, and generating a transient voltage waveform according to the transient voltage levels; (d) measuring steady voltage levels of the VRM under thermal effects generated by the microprocessor; and (e) generating a performance report of the VRM by means of integrating various measurement results.

Other advantages and novel features of the embodiments will be drawn from the following detailed description with reference to the attached drawings, in which:

DETAILED DESCRIPTION OF THE INVENTION

Figure 1:
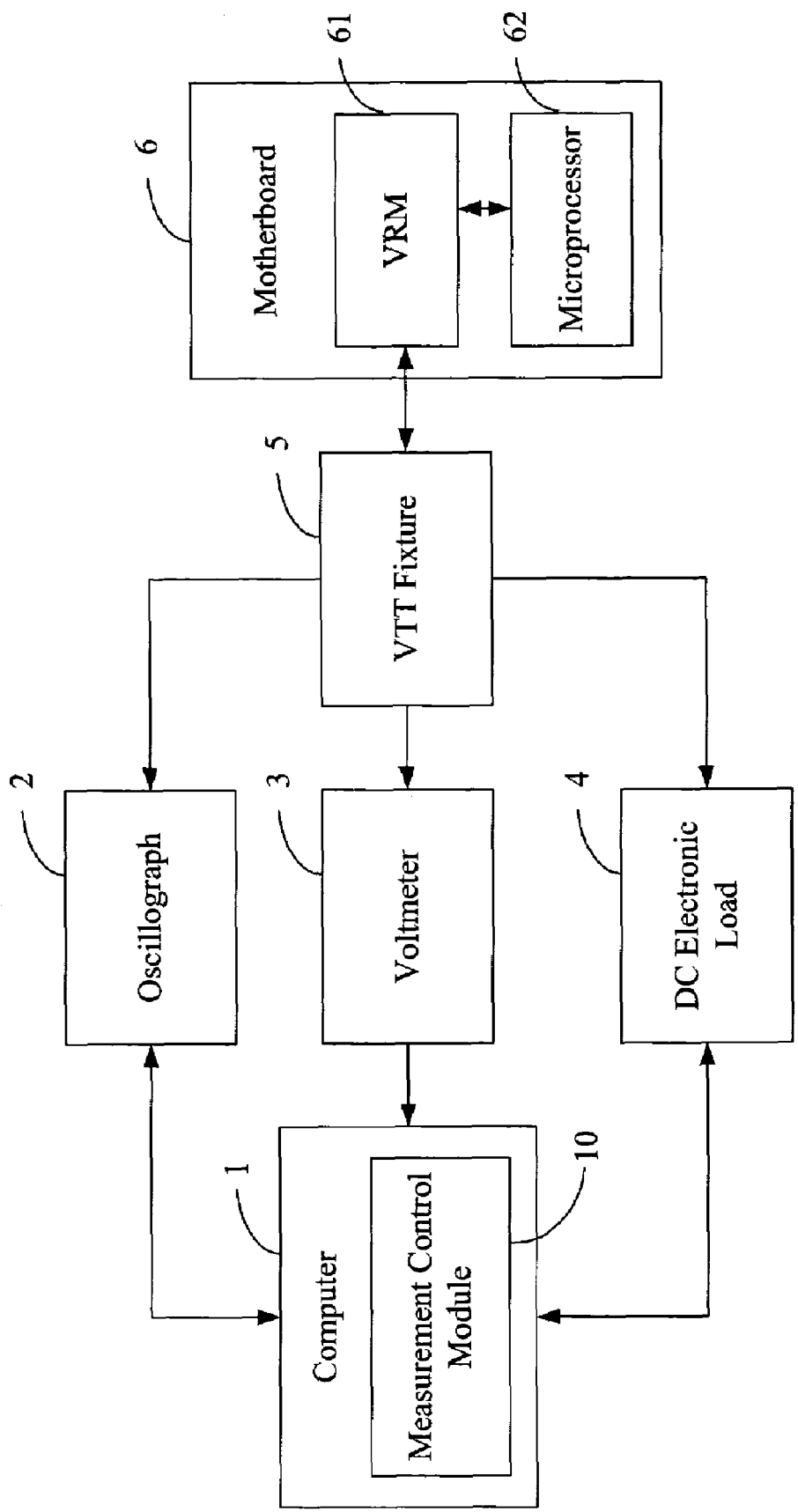
FIG. 1 is a schematic diagram of a system for measuring performance of a voltage regulator module attached to a microprocessor in accordance with a preferred embodiment.

FIG. 1 is a schematic diagram of a system for measuring performance of a voltage regulator module attached to a microprocessor (hereinafter "the system") in accordance with a preferred embodiment. The system includes a computer 1 installed with a measurement control module 10, an oscillograph 2, a voltmeter 3, a direct current (DC) electronic load 4, a voltage transient tester (VTT) fixture 5, and an under testing motherboard 6 coupled with a voltage regulator module (VRM) 61 and a microprocessor 62. The oscillograph 2, the voltmeter 3, and the DC electronic load 4 connect to the computer 1 and to the VTT fixture 5. The VTT fixture 5 further connects to the connection pin of the VRM 61.

The computer 1 is used for controlling the operations of the oscillograph 2, the voltmeter 3, and the DC electronic load 4 by utilizing the measurement control module 10, and further used for obtaining various measurement from the oscillograph 2, the voltmeter 3, and the DC electronic load 4. In the preferred embodiment, the measurement results typically include steady voltage levels, transient voltage levels, a transient voltage waveform, and the values of load currents.

The measurement control module 10 is used for generating load current control signals to control the DC electronic load 4 to educe the load currents of the VTT fixture 5 received from the VRM 61, and for generating a performance report of the VRM 61 by means of integrating the measurement results obtained by the computer 1.

The oscillograph 2 is used for measuring the transient voltage levels of the VRM 61 under different load currents, for generating the transient voltage waveform according to the transient voltage levels, and for sending the transient voltage levels and the transient voltage waveform to the computer 1.

The voltmeter 3 is used for measuring the steady voltage levels of the VRM 61 under the thermal effects generated by the microprocessor 62, and for sending the steady voltage levels to the computer 1.

The DC electronic load 4 is used for receiving the load current control signals generated by the measurement control module 10, for educing the load currents from the VRM 61 according to the load current control signals, and for sending the values of the load currents to the computer 1.

The VTT fixture 5 is used for providing connections of the oscillograph 2, the voltmeter 3, and the DC electronic load 4 corresponding with the VRM 61, and setting different working voltage levels of the VRM 61 in order to have the VRM work in different load currents.

The VRM 61 is attached to the microprocessor 62 and further mounted on the motherboard 6. The VRM 61 is used for transforming the working voltage levels into the core voltage levels before supplying the core voltage levels to the microprocessor 62. This is done to ensure that the microprocessor 62 works in a proper state.

Figure 2:
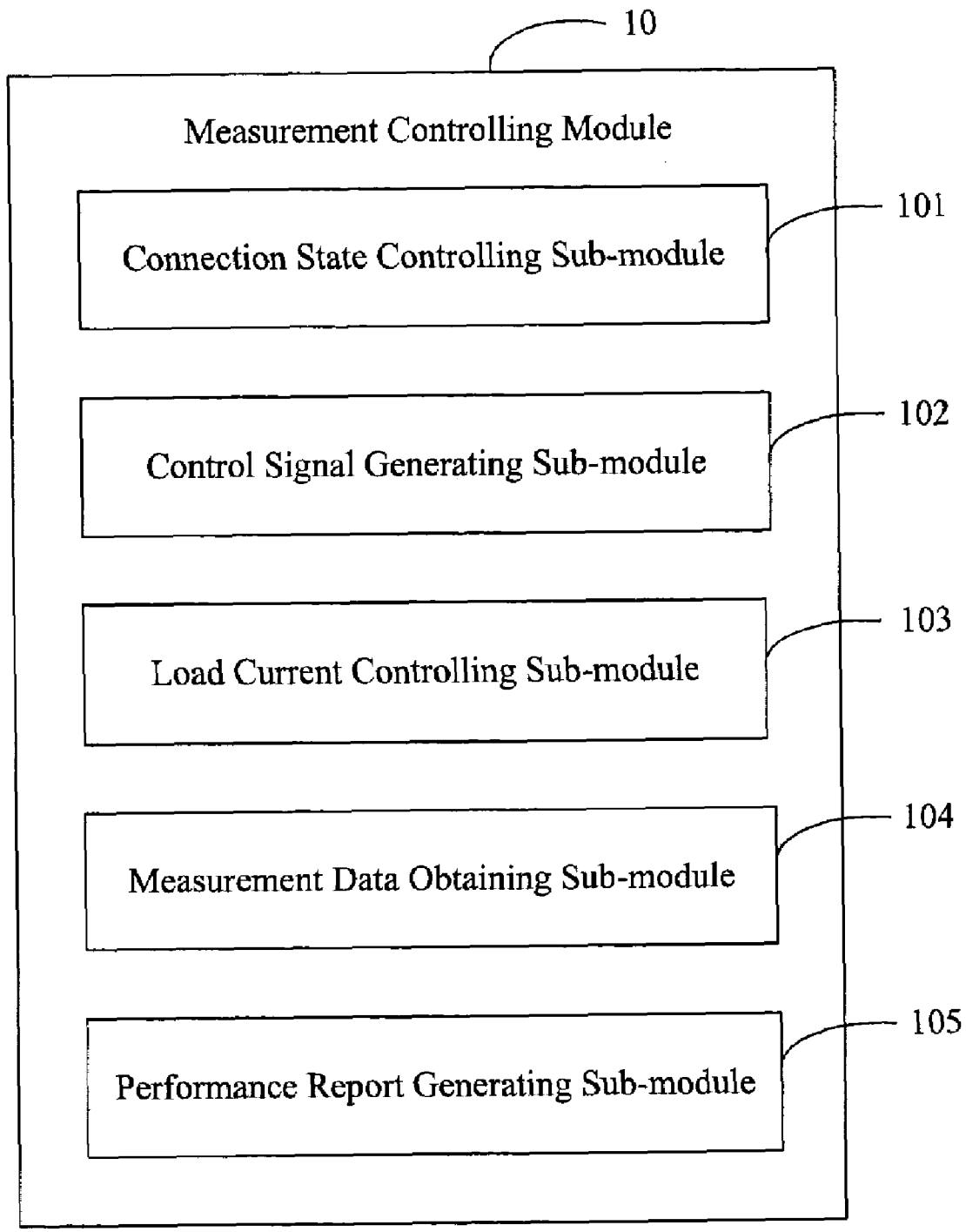
FIG. 2 is a schematic diagram of function modules of the measurement control module of FIG. 1.

FIG. 2 is a schematic diagram of function modules of the measurement control module 10. In the preferred embodiment, the measurement control module 10 is installed in the computer 1, and includes a connection state controlling sub-module 101, a control signal generating sub-module 102, a load current controlling sub-module 103, a measurement data obtaining sub-module 104, and a performance report generating sub-module 105.

The connection state controlling sub-module 101 is used for controlling the connections between the computer 1 with the oscillograph 2, the voltmeter 3 and the DC electronic load 4, the connections between the VTT fixture 5 with the oscillograph 2, the voltmeter 3 and the DC electronic load 4, and the connection between the VTT fixture 5 with the VRM 61 of the motherboard 6.

The control signal generating sub-module 102 is used for generating load current control signals according to measurement parameters input by a user from the computer 1. The measurement parameters may be the working voltage control parameters and the load current control parameters.

The load current controlling sub-module 103 is used for sending the load current control signals to the DC electronic load 4, and for controlling the DC electronic load 4 to educe load currents from the VRM 61 according to the load current control signals.

The measurement data obtaining sub-module 104 is used for obtaining various measurement results that include the transient voltage levels and the transient voltage waveform from the oscillograph 2, the steady voltage levels of the VRM 61 from the voltmeter 3, and the values of the load currents from the DC electronic load 4.

The performance report generating sub-module 105 is used for generating a performance report of the VRM 61 by means of integrating the measurement results obtained by the measurement data obtaining sub-module 104.

Figure 3:
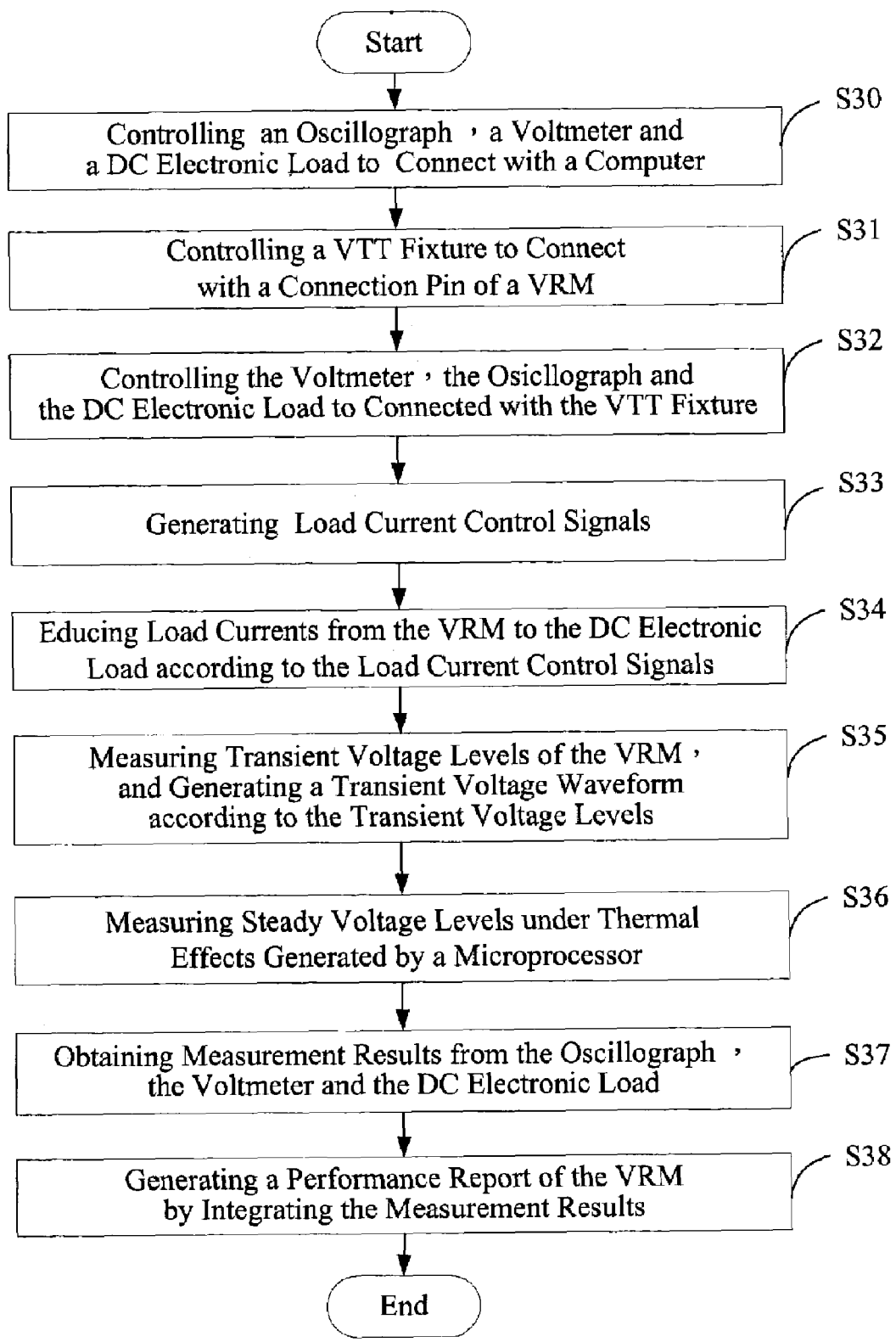
FIG. 3 is a flowchart of a preferred method for measuring performance of a voltage regulator module attached to a microprocessor by implementing the system of FIG. 1.

FIG. 3 is a flowchart of a preferred method for measuring performance of a voltage regulator module attached to a microprocessor by implementing the system as described above.

In step S30, the connection state controlling sub-module 101 controls the oscillograph 2, the voltmeter 3 and the DC electronic load 4 to connect with the computer 1, and displays the respective connection states in the computer 1. In step S31, the connection state controlling sub-module 101 controls the VTT fixture 5 to connect with the connection pin of the VRM 61, and displays the connection state in the computer 1. In step S32, the connection state controlling sub-module 101 controls the oscillograph 2, the voltmeter 3, and the DC electronic load 4 to connect with the VTT fixture 5 correspondingly, and displays their respective connection states in the computer 1.

In step S33, the control signal generating sub-module 102 generates load current control signals for controlling the DC electronic load 4 to educe load currents of the VTT fixture 5 from the VRM 61. In step 34, the load current controlling sub-module 103 controls the DC electronic load 4 to educe the load currents from the VRM 61 according to the load current control signals.

In step S35, the oscillograph 2 measures transient voltage levels of the VRM 61 under different load currents, generates transient voltage waveform according to the transient voltage levels, and sends the transient voltage levels and the transient voltage waveform to the computer 1. In step S36, the voltmeter 3 measures steady voltage levels of the VRM 61 under the thermal effects generated by the microprocessor 62, and sends the steady voltage levels to the computer 1.

In step S37, the measurement data obtaining sub-module 104 obtains the measurement results that include the transient voltage levels and the transient voltage waveform from the oscillograph 2, the steady voltage levels from the voltmeter 3, and the values of the load currents from the DC electronic load 4. In step S38, the performance report generating sub-module 105, and generates a performance report of the VRM 61 by means of integrating various measurement results obtained by the measurement data obtaining sub-module 104.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A system for measuring performance of a voltage regulator module (VRM) attached to a microprocessor, the system comprising:

a voltage transient tester (VTT) fixture connected to the VRM for setting different working voltage levels of the VRM in order to have the VRM work in different load currents;

an oscillograph connected to a computer for measuring transient voltage levels of the VRM under the different load currents, and for generating a transient voltage waveform according to the transient voltage levels;

an voltmeter connected to the computer for measuring steady voltage levels of the VRM under thermal effects generated by the microprocessor;

a direct current (DC) electronic load connected to the computer for educing load currents of the VTT fixture from the VRM; and a measurement control module installed in the computer for generating load current control signals, and for controlling the DC electronic load to educe the load currents from the VRM according to the load current control signals, wherein the measurement control module comprises a performance report generating sub-module for generating a performance report of the VRM by integrating various measurement results that comprise the transient voltage levels, the transient voltage waveform, the steady voltage levels, and the values of the load currents.

2. The system according to claim 1, wherein the computer is used for controlling the operations of the oscillograph, the voltmeter, and the DC electronic load by utilizing the measurement control module.

3. The system according to claim 1, wherein the VTT fixture is further used for providing connections of the oscillograph, the voltmeter and the DC electronic load corresponding with the VRM.

4. The system according to claim 1, wherein the measurement control module comprises a control signal generating sub-module for generating the load current control signals according to measurement parameters input by a user.

5. The system according to claim 1, wherein the measurement control module comprises a load current controlling sub-module for controlling the DC electronic load to educe the load currents from the VRM according to the load current control signals.

6. The system according to claim 1, wherein the measurement control module comprises a measurement data obtaining sub-module for obtaining the measurement results that comprise of the transient voltage levels and the transient voltage waveform from the oscillograph, the steady voltage levels from the voltmeter, and the values of the load currents from the DC electronic load.

7. An electronic method for measuring performance of a voltage regulator module (VRM) attached to a microprocessor, the method comprising the steps of:

generating load current control signals to control a direct current (DC) electronic load to educe load currents of a voltage transient tester (VTT) fixture from the VRM;

controlling the DC electronic load to educe the load currents from the VRM according to the load current control signals;

measuring transient voltage levels of the VRM, and generating a transient voltage waveform according to the transient voltage levels;

measuring steady voltage levels of the VRM under thermal effects generated by the microprocessor; and providing a performance report generating sub-module for generating a performance report of the VRJVI by integrating various measurement results that comprise the transient voltage levels, the transient voltage waveform, the steady voltage levels, and the values of the load currents.

8. The method according to claim 7, farther comprising the step of setting different working voltage levels of the VRM in order to have the VRM work under different load currents.

9. The method according to claim 7, further comprising the steps of:

controlling the VTT fixture to connect with the VRM;

controlling an oscillograph, a voltmeter, and the DC electronic load to connect with a computer; and controlling the oscillograph, the voltmeter, and the DC electronic load to connect with the VTT fixture correspondingly.

10. The method according to claim 9, further comprising the step of obtaining the measurement results that comprise the transient voltage levels and the transient voltage waveform from the oscillograph, the steady voltage levels from the voltmeter, and the values of the load currents from the DC electronic load.

11. A system for measuring performance of a voltage regulator module (VRM) attached to a microprocessor, the system comprising a measurement control module installed in a computer, the measurement control module comprising:

a control signal generating sub-module for generating load current control signals according to measurement parameters input by a user;

a load current controlling sub-module for controlling a direct current (DC) electronic load to educe load currents of a voltage transient tester (VTT) fixture from the VRM according to the load current control signals;

a measurement data obtaining sub-module for obtaining various measurement results that comprise transient voltage levels and a transient voltage waveform measured by an oscillograph, steady voltage levels measured by an voltmeter, and the values of the load currents educed by the DC electronic load; and a performance report generating sub-module for generating a performance report of the VRM by integrating the measurement results.

12. The system according to claim 11, wherein the VTT fixture is used for providing connections of the oscillograph, the voltmeter and the DC electronic load corresponding with the VRM, and setting different working voltage levels of the VRM in order to have the VRM work in different load currents.

13. The system according to claim 11, wherein the oscillograph is used for measuring the transient voltage levels of the VRM, and generating the transient voltage waveform according to the transient voltage levels.

14. The system according to claim 11, wherein the voltmeter is used for measuring the steady voltage levels of the VRM under thermal effects generated by the microprocessor.

15. The system according to claim 11, wherein the DC electronic load is used for educing the load currents of the VTT fixture from the VRM according to the load current control signals.

* * * * *